United States Statutory Invention Registration [19]

[11] Reg. Number: H560

Gualtieri [43] Published: Dec. 6, 1988

[54] METHOD OF MANUFACTURING DISLOCATION AND ETCH CHANNEL FREE QUARTZ RESONATOR BLANKS

[75] Inventor: John Gualtieri, Oceanport, N.J.

[73] Assignee: The United States of America as represented by the Secretary of the Army, Washington, D.C.

[21] Appl. No.: 91,686

[22] Filed: Aug. 31, 1987

[51] Int. Cl.[4] ..... C03C 10/14

[52] U.S. Cl. ..... 156/601; 156/603; 156/623 Q; 23/301; 65/33; 65/DIG. 8; 51/283 R; 125/12

[58] Field of Search ..... 156/623 Q, 601, 603; 23/301; 65/33, DIG. 8

[56] References Cited

U.S. PATENT DOCUMENTS

| | | | |
|---|---|---|---|
| 3,291,575 | 12/1966 | Sawyer | 156/623 Q |
| 3,576,608 | 4/1971 | Gehres | 156/623 Q |
| 3,917,506 | 11/1975 | Lind et al. | 156/623 Q |
| 3,976,535 | 8/1976 | Barnes | 156/623 Q |
| 4,255,228 | 3/1981 | Vig | 156/623 Q |
| 4,576,808 | 3/1986 | Armington et al. | 156/603 |

OTHER PUBLICATIONS

Barns et al., "Production and Perfection of 'Z-Face' Quartz", J. Crys. Growth, 34 (1976), 189–197.

*Primary Examiner*—Richard D. Lovering
*Assistant Examiner*—Eric Jorgensen
*Attorney, Agent, or Firm*—Sheldon Kanars; Roy E. Gordon

[57] ABSTRACT

Dislocation and etch channel-free quartz resonator blanks are made from a cultured quartz stone by visualizing the dislocation-free areas of the cultured quartz stone by X-ray topography, cutting seed plates for the next generation of crystal growth from the dislocation-free areas of the cultured quartz stone, growing dislocation free quartz from said seed plates using conventional growth techniques, and cutting dislocation-free quartz resonator blanks from said dislocation-free quartz.

7 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

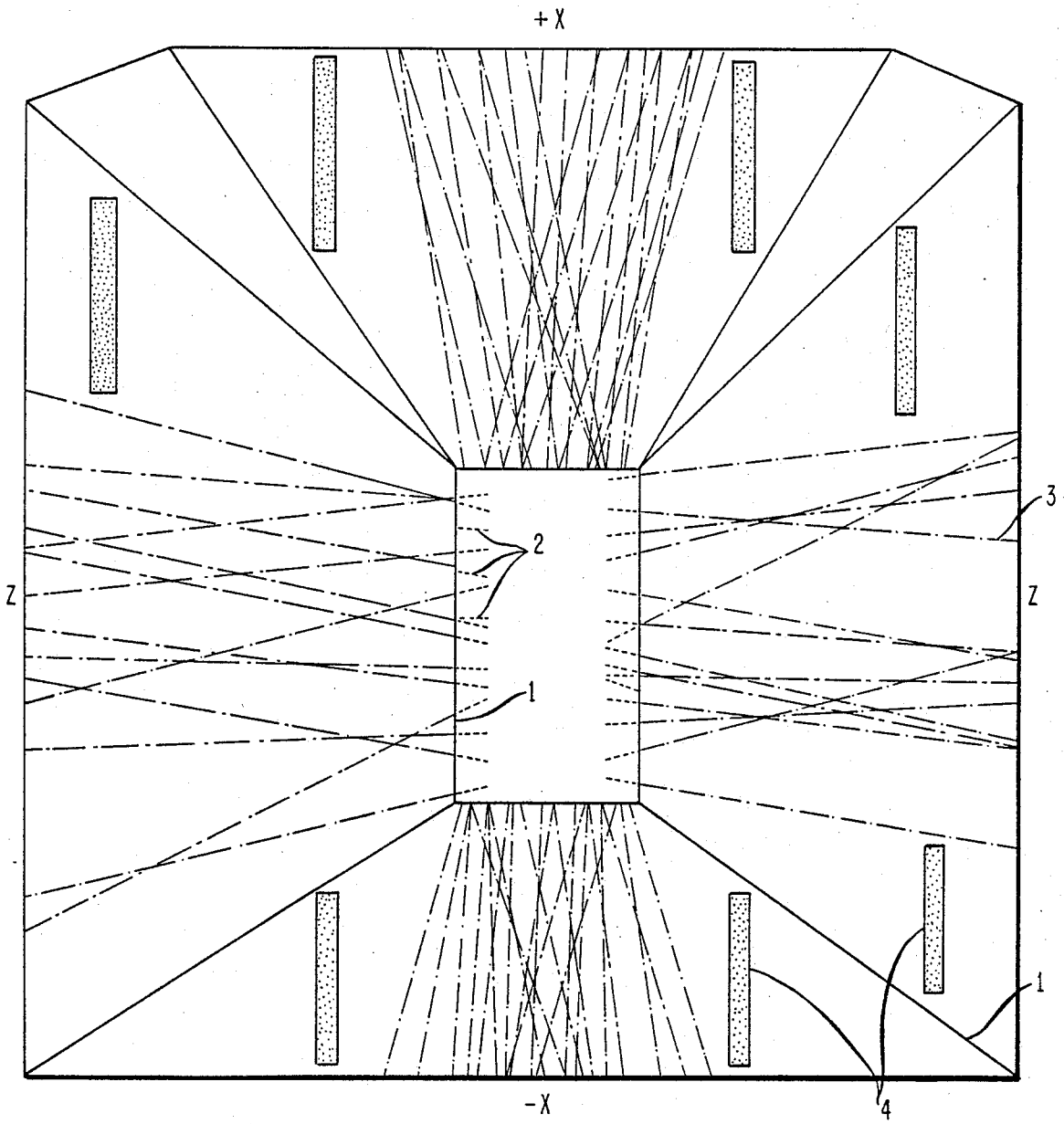
1 GROWTH SECTOR AND SEED BOUNDARIES
2 MINERALIZER-ETCHED CAVITIES
3 DISLOCATIONS
4 POSSIBLE Z-PLATE SEED LOCATIONS

METHOD OF MANUFACTURING DISLOCATION AND ETCH CHANNEL FREE QUARTZ RESONATOR BLANKS

The invention described herein may be manufactured, used, and licensed by or for the Government for governmental purposes without the payment to me of any royalty thereon.

This invention relates in general to a method of manufacturing dislocation and etch-channel-free quartz resonator blanks and in particular to a method of manufacturing dislocation and etch channel free quartz resonator blanks from a cultured quartz stone.

BACKGROUND OF THE INVENTION

It is generally accepted that for resonator applications, the quartz blanks will come from the Z-growth region of a cultured quartz stone. This is because of fewer impurities in the Z-region. Z-seed plates are generally used for the next generation growth of quartz and are usually cut from the Z-region even though the Z-plate could have been cut from any region of a cultured quartz stone. The Z-region is also structurally sounder than any of the other regions of the cultured quartz stone.

However, the dislocations in the Z-region run roughly parallel (within 15°) to Z. Therefore, these dislocations run roughly perpendicular to the Z-plate.

SUMMARY OF THE INVENTION

The general object of this invention is to provide a method of making a high stability quartz crystal resonator blank. A more particular object of the invention is to provide such a method of making a dislocation and etch-channel-free blank from a cultured quartz stone. Another object of the invention is to provide such a method wherein dislocations and resultant etch channels, caused by dislocations in the seed plate can be eliminated.

It has now been found that the aforementioned objects can be attained by taking the seed plates from the dislocation-free areas of a cultured quartz stone.

More particularly, according to the invention, the dislocation and etch-channel free areas of the cultured quartz stone are visualized by a suitable means as for example, X-ray topography, the seed plates cut from the dislocation-free areas, quartz grown from the dislocation-free seed plates, and the dislocation-free quartz resonator blanks then cut from the quartz.

DESCRIPTION OF THE DRAWING

The drawing is a schematic of a Y-cut section of cultured quartz as visualized by X-ray topography or by the etching of Y-cut test sections.

Referring to the drawing, 1 shows growth sector and seed boundaries, 2 shows mineralizer-etched cavities, 3 shows dislocations, and 4 shows possible Z-plate seed locations. The seed area is enlarged to show detail. Since dislocation directions are roughly parallel to the growth direction in each growth sector, areas close to the sector boundaries are free of dislocations. Prospective Z-seed plate areas are shown for each sector.

As seen in the drawing, there are areas in either the X-or Z-growth sectors which should be free of dislocations. Seed plates cut from these areas should not produce mineralizer-etched cavities or dislocations/etch channels in the Z-growth regions during growth.

I wish it to be understood that I do not desire to be limited to the exact details as described for obvious modifications will occur to a person skilled in the art.

What is claimed is:

1. Method of manufacturing dislocation and etch channel-free quartz resonator blanks from a non dislocation-free quartz stone, comprising locating dislocation and etch channel-free areas in the x and z regions of the non dislocation-free quartz stone that are outside of ±15° from the normals to the original seed boundary using y-test plates, cutting seed plates for the next generation of crystal growth from the dislocation-free areas of the non disclosure-free quartz stone, and growing dislocation free quartz from said seed plates using conventional cultured quartz growth techniques.

2. Method according to claim 1 wherein said quartz stone is a cultured quartz stone.

3. Method according to claim 2 wherein the seed plate is a Z-seed plate.

4. Method according to claim 3 wherein the Z-seed plate is cut out of the Z-growth region of the cultured quartz stone.

5. Method according to claim 3 wherein the Z-seed plate is cut out of the X-growth region of the cultured quartz stone.

6. Method according to claim 2 wherein the dislocation-free areas of the cultured quartz are visualized by X-ray topography.

7. Method according to claim 2 wherein the dislocation-free areas of the cultured quartz stone are located by the etching of Y-cut test sections.

* * * * *